United States Patent
Zhang

(10) Patent No.: US 9,906,745 B2
(45) Date of Patent: Feb. 27, 2018

(54) COLUMN COMPARATOR SYSTEM AND METHOD FOR COMPARING A RAMPING SIGNAL AND AN INPUT SIGNAL

(71) Applicant: CISTA SYSTEM CORP., Grand Cayman (KY)

(72) Inventor: Guangbin Zhang, Cupertino, CA (US)

(73) Assignee: CISTA SYSTEM CORP., Grand Cayman (KY)

( * ) Notice: Subject to any disclaimer, the term of this patent is extended or adjusted under 35 U.S.C. 154(b) by 607 days.

(21) Appl. No.: 14/561,015

(22) Filed: Dec. 4, 2014

(65) Prior Publication Data

US 2015/0172580 A1 Jun. 18, 2015

Related U.S. Application Data

(60) Provisional application No. 61/915,394, filed on Dec. 12, 2013.

(51) Int. Cl.
*H04N 5/3745* (2011.01)
*H03M 1/12* (2006.01)
*H03M 1/18* (2006.01)
*H04N 5/378* (2011.01)

(52) U.S. Cl.
CPC .......... *H04N 5/3745* (2013.01); *H03M 1/129* (2013.01); *H03M 1/18* (2013.01); *H04N 5/378* (2013.01)

(58) Field of Classification Search
None
See application file for complete search history.

(56) References Cited

U.S. PATENT DOCUMENTS

| | | | | |
|---|---|---|---|---|
| 5,793,322 A | * | 8/1998 | Fossum | H04N 3/155 341/161 |
| 6,147,519 A | * | 11/2000 | Krymski | H03K 5/249 327/536 |
| 6,307,497 B1 | * | 10/2001 | Leung | H03M 1/129 341/139 |
| 7,259,609 B2 | * | 8/2007 | Pentakota | H03F 3/45188 327/309 |
| 7,741,981 B1 | | 6/2010 | Wan et al. | |
| 7,903,018 B2 | * | 3/2011 | Schatzberger | H03M 1/129 341/155 |
| 9,509,926 B2 | * | 11/2016 | Muto | H03M 1/183 |
| 2010/0164761 A1 | | 7/2010 | Wan et al. | |

FOREIGN PATENT DOCUMENTS

| | | |
|---|---|---|
| CN | 101650223 | 2/2010 |
| CN | 101662283 A | 3/2010 |
| CN | 102055314 A | 5/2011 |
| CN | 102647566 A | 8/2012 |

OTHER PUBLICATIONS

First Notice issued by China State Intellectual Property Office, dated Mar. 3, 2017 for Chinese Patent Application No. 201410742541.1.
Zhang et al., "Design of a High Resolution Column ADC for CMOS Image Sensor", Research & Progress of SSE, vol. 23, No. 3, Aug. 2006, pp. 349-353.

* cited by examiner

*Primary Examiner* — Howard Williams

(57) ABSTRACT

A system and method is provided for image sensing. The image sensing system includes a comparator for comparing an input signal representing a sensed light signal from at least one pixel of the image sensing system and a reference signal. The comparator includes at least one digital transistor.

18 Claims, 6 Drawing Sheets

COLUMN COMPARATOR SYSTEM AND METHOD FOR COMPARING A RAMPING SIGNAL AND AN INPUT SIGNAL

CROSS REFERENCE TO RELATED APPLICATION

This application claims the benefit of priority to U.S. Provisional Application No. 61/915,394, filed with the United States Patent and Trademark Office on Dec. 12, 2013, and entitled "A COLUMN-PARALLEL COMPARATOR STRUCTURE WITH OPTIMIZED PERFORMANCE," which is hereby incorporated by reference in its entirety.

TECHNICAL FIELD

The present disclosure relates to methods and circuits for image sensing applications, in particular, to methods and circuits for comparing a ramping signal and an input signal generated by an image sensing circuit.

BACKGROUND INFORMATION

Digital cameras, scanners, and other imaging devices often use image sensors, such as charge-coupled device (CCD) image sensors or complementary metal-oxide-semiconductor (CMOS) image sensors, to convert optical signals to electrical signals. An image sensor typically includes a grid of pixels, row access circuitry, column access circuitry, a ramp signal generator, and comparators. The pixels capture the light impinged on them and convert the light signals to electrical signals. The converted signals are usually analog signals. The row access circuitry controls which row of pixels that the sensor will read. The column access circuitry includes column read circuits that read the signals from corresponding columns. The ramp signal generator generates a ramping signal as a global reference signal for column read circuits to record the converted electrical signal. Comparators compare the ramping signals and the readout signals from the pixels, and convert the readout signals from analog signals to digital signals for representing the sensed pixels in a digital format.

In a typical image sensor circuit, a large number of comparators (e.g., thousands) may be used such that the conversion of readout signals can be performed in parallel. Because a conventional comparator receives analog signals as input signals, it naturally uses analog circuits as its basic building components. Analog circuits typically include analog transistors having minimum feature sizes that are greater than those of digital transistors.

Moreover, because a large number of comparators are used, a significant portion of the total power consumption and the vertical fixed-pattern noise (VFPN) of an image sensor circuit may be attributed to the comparators. Additionally, analog type comparators may have a slower conversion speed, due to the low operation speed of analog transistors.

SUMMARY

The present disclosure provides an image sensing system. According to some embodiments, the image sensing system includes a comparator for comparing an input signal representing a sensed light signal from at least one pixel of the image sensing system and a reference signal. The comparator includes at least one digital transistor.

The present disclosure also provides another image sensing system. According to some embodiments, the image sensing system includes a comparator for comparing an input signal representing a sensed light signal from at least one pixel of the image sensing system and a reference signal. The comparator includes a charge sharing circuit for reducing a signal range of the input signal.

The present disclosure also provides a method for comparing a reference signal and an input signal representing a sensed light signal from at least one pixel of an image sensing system. According to some embodiments, the method includes receiving the input signal and the reference signal by a charge sharing circuit; providing, by the charge sharing circuit, a first amplifier input signal based on at least the input signal and the reference signal, and generating, by a first amplifier having at least one digital transistor, a first amplifier output signal based on the first amplifier input signal.

DETAILED DESCRIPTION OF THE DRAWINGS

Reference will now be made in detail to the exemplary embodiments consistent with the embodiments disclosed herein and the examples of which are illustrated in the accompanying drawings. Wherever possible, the same reference numbers will be used throughout the drawings to refer to the same or similar parts.

Figure 1:
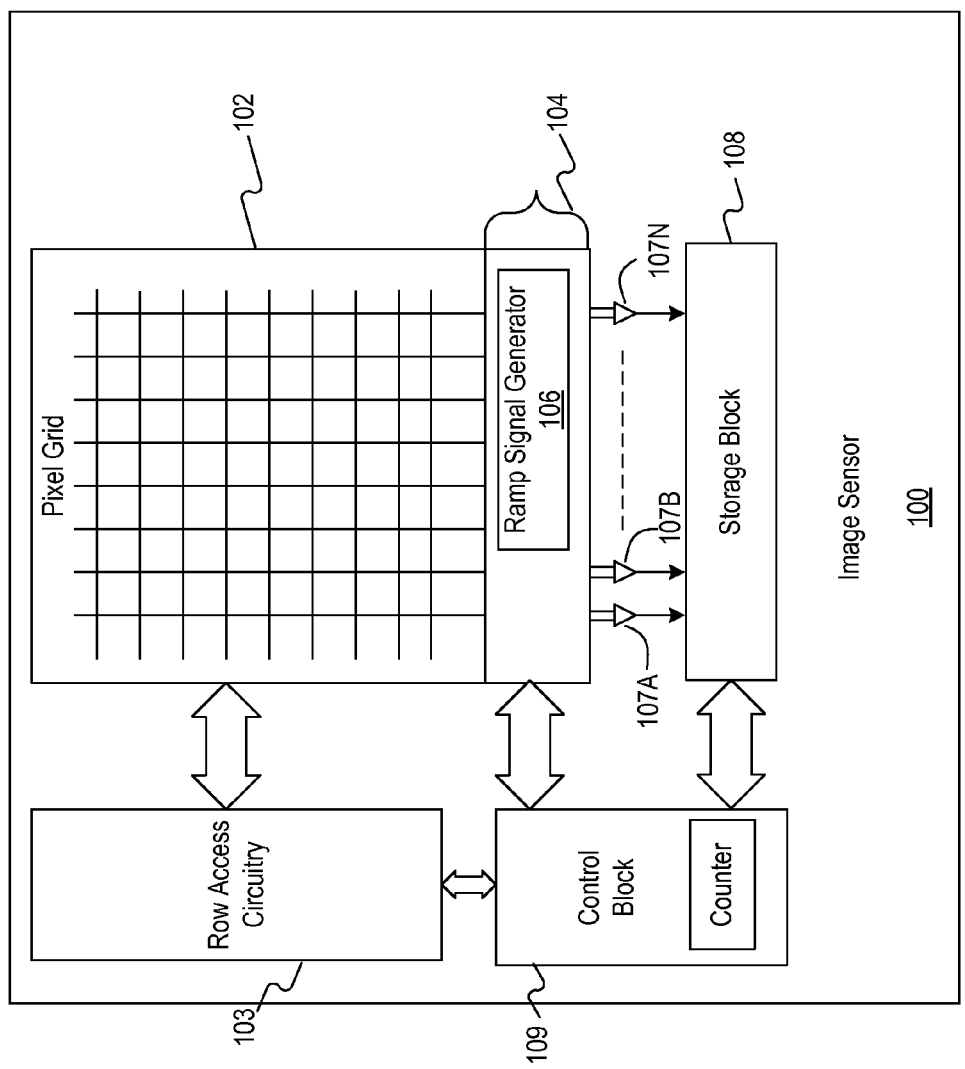
FIG. 1 is a diagram illustrating an exemplary image sensor.

FIG. 1 is a diagram illustrating an exemplary image sensor 100. Image sensor 100 can be a CMOS type image sensor or a CCD type image sensor, or any other type of image sensors. Image sensor 100 may include a two-dimensional grid of pixels 102, row access circuitry 103, column access circuitry 104, a ramp signal generator 106, a series of comparators 107A-N, a storage block 108, and a control block 109. The image sensor circuitry is divided into blocks as shown in FIG. 1 for illustration purpose. A person having ordinary skill in the art should understand that at least some of these blocks can be integrated together on one chip.

Pixel grid 102 includes multiple pixels for sensing light signals and converting the light signals to electrical signals. Each pixel can generate a voltage that is proportional to the energy of the sensed light signal. As shown in FIG. 1, pixel grid 102 is electrically coupled to row access circuitry 103 and column access circuitry 104. Row accessing circuitry 103 can select one row at a time in pixel grid 102. When a particular row is selected, voltages generated by the pixels in that row can become accessible by, for example, column access circuitry 104.

Column access circuitry 104 includes multiple column read circuits (not shown) each corresponding and being coupled to a column in pixel grid 102. The column read circuits read the voltage signals generated by the pixels in the corresponding columns and provide output readout signals.

Ramp signal generator 106 generates a ramping signal, e.g., a monotonically increasing or decreasing reference signal "Vramp." Ramp signal generator 106 can include, for example, a counter 260, a digital to analog converter (DAC) 270, and a bias generator 280. The operation of ramp signal generator 106 will be described in detail below.

Comparators 107A-N each corresponds and is electrically coupled to one of the column read circuits to receive the readout signal. Comparators 107A-N are also electrically coupled to ramp signal generator 106 to receive the Vramp signal. Each comparator (e.g., 107A) compares the readout signal with the Vramp signal. In some embodiments, the Vramp signal may start from zero and monotonically increase (or start with a maximum value and monotonically decrease). When Vramp changes from lower than the readout signal to higher than the readout signal, the comparator output will switch from, e.g., low to high (e.g., from 0 to 1). Alternatively, the readout signal and the Vramp signal, or variations of these signals, can be combined and when the combined signal reaches a certain level, the comparator output will switch. A person having ordinary skill in the art should appreciate that other configurations can be used, such as, subtracting the Vramp signal from the readout signal and compare the result to a reference signal. The person having ordinary skill in the art should be able to design circuits to implement these functions. The internal circuits of comparator 107 will be described in detail below.

As shown in FIG. 1, the comparators 107A-N are electrically coupled to a storage block 108. Storage block 108 can include, for example, static random access memory (SRAM), dynamic random access memory (DRAM), flash memory, or any other type of storage circuits that can store analog or digital signals.

Control block 109 is electrically coupled to row access circuitry 103, column access circuitry 104, ramp signal generator 106, comparators 107A-N, and storage block 108, and provides one or more signals for controlling these circuits. For example, control block 109 can provide control signals to row access circuitry 103 for controlling the speed of accessing the rows in pixel grid 102. Control block 109 can also generate any desired signals for controlling other circuits in image sensor 100.

Control block 109 may include one or more counters that are electrically coupled to comparators 107A-N and storage block 108. For example, each counter may be coupled to a corresponding comparator 107. Control block 109 may also generate a clock signal to trigger the counter to count the clock cycles. The comparators 107A-N compare Vramp and the readout signals from the columns of pixel grid 102. At the comparator, for example, comparator 107A, when Vramp becomes higher than the readout signal from column A, or the combination of Vramp and the readout signal reaches to a certain level, comparator 107A switches its output from 0 to 1, and that will trigger storage block 108 to record the value in the counter corresponding to comparator 107A at that moment. The recorded value can be a digital representation of the readout signal from column A.

As discussed above, row accessing circuitry 103 can select one row at a time in pixel grid 102 and column access circuitry 104 can read the voltage signals generated by the pixels in the selected row. The voltage signals obtained by column access circuitry 104 are converted to digital signals and stored in storage block 108. After all rows are selected and all voltage signals are readout, the image sensed by pixel grid 102 can be represented by a two-dimensional grid of digital representations stored in storage block 108 and that can be used to form a digital image.

Figure 2:
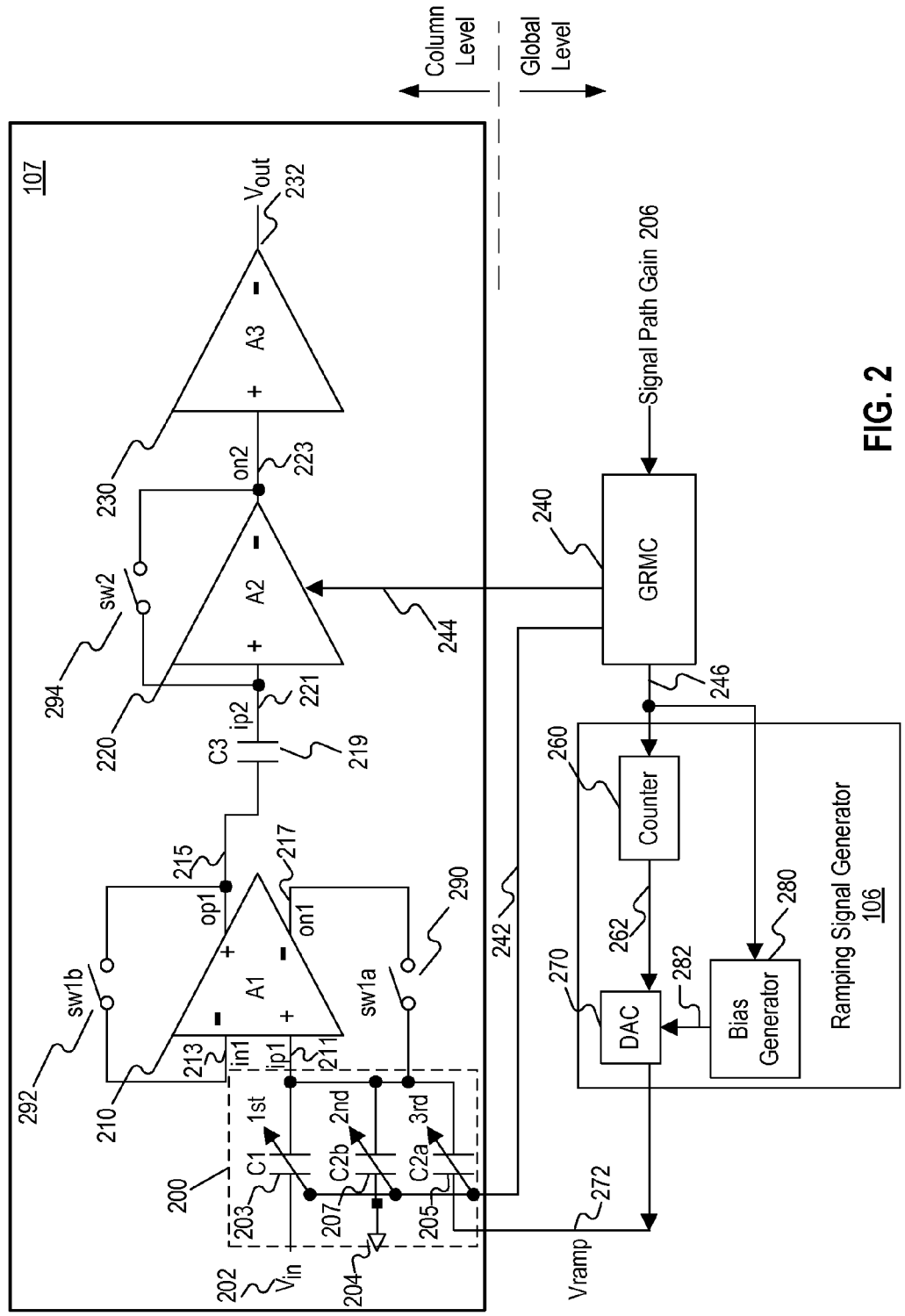
FIG. 2 is a block diagram illustrating an exemplary comparator, an exemplary ramp signal generator, and an exemplary gain-related mode controller (GRMC).

FIG. 2 is a block diagram illustrating an exemplary comparator 107, an exemplary ramp signal generator 106, and an exemplary gain-related mode controller (GRMC) 240. FIG. 2 depicts ramp signal generator 106 and GRMC 240 at a global level, and comparator 107 at column level. In other words, according to some embodiments, image sensor includes a comparator 107 for each column of pixel grid 102 and a ramp signal generator 106 and a GRMC 240 for all comparators. As such, one or more of comparators 107 may receive the same signals generated by ramp signal generator 106, including ramping signal 272. One or more comparators 107 may also receive the same signals generated by GRMC 240, include a reduction control signal 242 and a mode control signal 244.

Referring to FIG. 2, comparator 107 can compare an input signal 202 (e.g., "Vin") and ramping signal 272. The term "compare" is used in a broad sense in this application. For example, one way to compare the two signals is coupling the two signals to two input terminals of a comparator. Another way is to combine the two signals (or variations of the two signals) and compare the combined signal with a reference signal. A variation may be an inversion of one signal, and thus, combining the two signals can be using one signal to subtract anther signal. The reference signal can be a reference voltage or current. In some embodiments, the reference signal can be a threshold voltage of a transistor, and when the combined signal reaches the reference signal level, it will turn on or off the transistor. Because the value of the reference signal and ramping signal can be known, the value of the input signal can be derived. A person having ordinary skill in the art should be able to design other ways to derive the value of the input signal.

In some embodiments, comparator 107 may include one or more amplifiers 210 (e.g., "A1"), 220 (e.g., "A2"), and 230 (e.g., "A3"); a charge sharing circuit 200 including one or more capacitors 203 (e.g., "C1"), 205 (e.g., "C2*a*"), 207 (e.g., "C2*b*"), and 219 (e.g., "C3"); and one or more switches 290 (e.g., "sw1*a*"), 292 (e.g., "sw1*b*"), and switch 294 (e.g., "sw2").

In some embodiments, amplifier 210, switches 290 and 292, capacitors 203, 205, and 207, and their interconnections can form a first stage of comparator 107. In the first stage, a first terminal of capacitor 203 receives input signal 202. Input signal 202 can be, for example, a readout signal provided by column access circuitry 104. A second terminal of capacitor 203 is electrically coupled to a first input terminal 211 of amplifier 210 (e.g., the positive input terminal "ip1"). A first terminal of capacitor 205 receives ramping signal 272 generated by ramp signal generator 106. A second terminal of capacitor 205 is electrically coupled to the first input terminal 211 of amplifier 210. A first terminal of capacitor 207 receives a ground signal 204. In some embodiments, the first terminal of capacitor 207 receives input signal 202 or ramping signal 272. The operation of the charge sharing circuit 200 including capacitors 203, 205, and 207 is described in detail below.

Referring to FIG. 2, in the first stage of comparator 107, first input terminal 211 of amplifier 210 can also be electrically coupled to a first terminal of switch 290. A second terminal of switch 290 is electrically coupled to a first output terminal 217 of amplifier 210 (e.g., a negative output terminal "on1"). Moreover, a second input terminal 213 of amplifier 210 (e.g., a negative input terminal "in1") can be electrically coupled to a first terminal of switch 292. A second terminal of switch 292 is electrically coupled to a second output terminal 215 of amplifier 210 (e.g., a positive output terminal "op1"). Switches 290 and 292 can electrically open or close to conduct current between the two terminals.

Referred to FIG. 2, in some embodiments, second amplifier 220, switch 294, capacitor 219, and their interconnections can form a second stage of comparator 107. In the second stage, a first terminal of capacitor 219 receives the output signal generated by amplifier 210 by, for example, electrically coupling to second output terminal 215 of amplifier 210 in the first stage. A second terminal of capacitor 219 is electrically coupled to an input terminal 221 of amplifier 220 (e.g., an input terminal "ip2"). Input terminal 221 of amplifier 220 is also electrically coupled to a first terminal of switch 294. A second terminal of switch 294 is electrically coupled to an output terminal 223 of amplifier 220 (e.g., an output terminal "on2"). The operation of the second stage of comparator 107 is described in detail below.

Referring to FIG. 2, in some embodiments, amplifier 230 can form a third stage of comparator 107. In the third stage, amplifier 230 receives the output signal generated by amplifier 220. Amplifier 230 can generate an output signal 232 (e.g., "Vout") based on the output signal generated by amplifier 220. While comparator 107, as shown in FIG. 2, includes all three stages, a person having ordinary skill in the art should understand that the second stage and the third stage are optional. In some embodiments, if the first stage is sufficient to meet a desired performance requirement, comparator 107 may not include the second stage and the third stage. Similarly, if the first stage and the second stage are sufficient to meet a desired performance requirement, comparator 107 may not include the third stage. Therefore, in these embodiments, comparator 107 may include only the first stage, or only the first stage and the second stage.

Referring to FIG. 2, in operation, comparator 107 can compare input signal 202 with ramping signal 272. In some embodiments, the operation of comparator 107 may include an auto-zero phase and a comparison phase. Comparator 107 may perform the auto-zero phase before it performs the comparison phase. In the auto-zero phase, one or more switches 290, 292, and 294 may be closed for a certain period of time to perform the auto-zero operation.

Referring to FIGS. 1 and 2, in the auto-zero operation, control block 109 closes switches 290 and 292 for a pre-configured period of time. After switches 290 and 292 are closed, first input terminal 211 is electrically coupled to first output terminal 217; and second input terminal 213 is electrically coupled to second output terminal 215. The electrical coupling of the input terminals to their corresponding output terminals of amplifier 210 can provide self-biasing to amplifier 210 such that amplifier 210 operates at a balanced operational point. As a result of the self-biasing, the output signal of amplifier 210 (e.g., the signal associated with second output terminal 215) can have a desired voltage (e.g., a voltage that is half of the power supply voltage).

Similarly, in the auto-zero operation, control block 109 can also close switch 294 for a preconfigured period of time such that input terminal 221 of amplifier 220 is electrically coupled to output terminal 223. The coupling of the input terminal to its output terminal of amplifier 220 can also provide self-biasing to amplifier 220 such that amplifier 220 operates at a balanced operational point. As a result of the self-biasing, the output signal of amplifier 220 (e.g., the signal associated with output terminal 223) can have a desired voltage (e.g., a voltage that is half of the power supply voltage).

Referring to FIGS. 1 and 2, after one or both amplifiers 210 and 220 are self-biased, control block 109 can open switches 290, 292, and 294, ending the auto-zero phase.

In the comparison phase, capacitor 205 receives ramping signal 272 and input signal 202, such as a readout signal. Ramping signal 272 may be a step-shape ramping signal (e.g., a monotonically increasing or decreasing signal with a desired slope (e.g., 1 V/uS)). In some other embodiments, ramping signal 272 may have other shapes. Ramping signal 272 may increase from a first voltage (e.g., 0V) to a second voltage (e.g., the power supply voltage). Comparator 107 can compare input signal 202 with ramping signal 272 as ramping signal 272 increases. In some embodiments, when the voltage of ramping signal 272 changes from lower than input signal 202 to higher than input signal 202, the output signal 232 of comparator 107 will switch from, e.g., low to high (e.g., from 0 to 1). In some other embodiments, the input signal 202 and the ramping signal 272, or variations of these signals, can be combined at the charge sharing circuit 200, and when the combined signal (the output of the charge sharing circuit 200) reaches a reference signal level, the output of comparator 107 will switch. The operation of the comparison phase is described in detail below.

In the comparison phase, before comparing ramping signal 272 with input signal 202, an initial input signal may be applied to comparator 107 to set the comparator output to be low. The initial input signal can be, for example, 0V, corresponding to a dark light or no light sensed by a pixel in pixel grid 102.

In some embodiments, after output signal 232 of comparator 107 switches to, for example, low, corresponding to the initial input signal, comparator 107 receives input signal 202, which may be a readout signal. To compare with input signal 202, ramping signal generator 106 resets ramping signal 272 so that it increases again from its minimum value (e.g., 0V).

Referring to FIG. 2, using the charge sharing circuit 200, comparator 107 can compare the combined voltage of ramping signal 272 and input signal 202 with a threshold voltage. For example, due to the configuration of the charge sharing circuit 200 shown in FIG. 2, input signal 202 and ramping signal 272 may be superimposed and first input terminal 211 of amplifier 210 may receive a combined voltage of input signal 202 and ramping signal 272. When the combined voltage exceeds a preconfigured threshold voltage, output signal 232 changes from, e.g., low to high.

As an example, in the first stage of comparator 107, as the voltage of ramping signal 272 increases, the combined voltage of input signal 202 and ramping signal 272 increases. When the output voltage of the charge sharing circuit 200 exceeds the threshold voltage, (e.g., the threshold voltage of a NMOS transistor of amplifier 210), the output signal of amplifier 210 (e.g., the signal associated with second output terminal 215) switches from, e.g., low to high. In turn, in the second stage, the output signal of amplifier 220 (e.g., the signal associated with output terminal 223) switches from high to low. Similarly, in the third stage, the output signal 232 (e.g., "Vout") switches from low to high.

Referring to FIGS. 1 and 2, when the voltage of output signal 232 switches, that may trigger storage block 108 to record the counter value of counter 260. Alternatively, the output signal 232 may trigger control block 109 to record the value of a separate counter, such as the counter shown in FIG. 1. The recorded counter value can be used to represent the value of the ramping signal. In the example that the counter value of counter 260 is used, ramp signal generator 106 can provide ramp code 262 to storage block 108. Ramp code 262 may represent the current counter value, which can be a digital representation of ramping signal 272. Input signal 202 can be derived from the reference value at input terminal 213 of amplifier 210 and the value of ramping signal 272.

Due to its analog nature, input signal 202 may have a signal range that is greater than the preferred or operational signal range of the low-voltage digital MOSFET devices used in one or more amplifiers 210, 220, and 230. For example, input signal 202 may have a voltage range from 0V to 3V, while the low-voltage digital MOSFET devices may have a preferred or operational voltage range of 0V to 1.5V. As shown in FIG. 2, the charge sharing circuit 200 including one or more capacitors 203, 205, and 207 can enable reducing of the signal range of input signal 202 to reduce the mismatch between the signal range of input signal 202 and the signal range of the low-voltage digital MOSFET devices used in one or more amplifiers 210, 220, and 230. For example, the configuration of the charge sharing circuit 200 can be adjusted by changing the capacitance values of capacitors 203, 205, and 207 or the connections among the capacitors 203, 205, and 207 such that the signal range of the input signal of amplifier 210 (e.g., the signal associated with the first input terminal 211 of amplifier 210) is reduced from the signal range of input signal 202 by a reduction ratio. In some embodiments, the reduction ratio may equal the capacitance value of capacitor 203 divided by the sum of the capacitance values of capacitors 203, 205, and 207. Thus, the voltage range of the input signal of amplifier 210 with respect to the voltage range of input signal 202 is expressed in formula (1) below.

$$V(\text{range},ip1)=V(\text{range},Vin)*\text{reduction\_ratio, wherein reduction\_ratio}=C1/(C1+C2a+C2b) \quad (1)$$

As shown in formula (1), the signal range of the input signal of amplifier 210 can be configured by adjusting the capacitance values of capacitors 203, 205, and 207. For example, if the capacitance values of capacitors 203, 205, and 207 are such that the reduction ratio equals to 0.5, the signal range of the input signal of amplifier 210 can be reduced to half of the signal range of input signal 202.

Referring to FIG. 2, GRMC 240 can configure the capacitance values of capacitors 203, 205, and 207 based on a signal path gain associated with comparator 107. The signal path gain is the magnitude and conversion time relation from the input of comparator 107 to the output of comparator 107 (e.g., from input signal 202 to output signal 232). The conversion time may be expressed as a time delay between the time that ramping signal 272 starts to increase and the time that output signal 232 switches from, e.g., low to high. The signal path gain may be proportional to the signal range of input signal 202. As an example, if the signal range of input signal 202 is 1V and the conversion time is 1 us, the signal path gain is thus 1 us/V. Similarly, if the signal range of input signal 202 is 1V and the conversion time delay is 2 us, the signal path gain is 2 us/V. In some embodiments, control block 109 may measure and provide the signal path gain. A person of ordinary skill in the art should understand that any other suitable circuit may measure and provide the signal path gain.

Referring to FIGS. 1 and 2, GRMC 240 may receive the value of signal path gain 206 from, for example, control block 109, storage block 108, and/or any other suitable circuits of image sensor 100. Based on signal path gain 206, GRMC 240 can generate a reduction control signal 242 to adjust the configuration of charge sharing circuit 200, for example, by changing the capacitance values of capacitors 203, 205, and 207 or the connections of capacitors 203, 205, and 207. As an example, after receiving signal path gain 206, GRMC 240 can compare signal path gain 206 with a configurable threshold gain. The threshold gain is a predetermined threshold value of a signal path gain for determining whether the signal path gain is low or high. If signal path gain 206 is less than the threshold gain, which may indicate that the signal range of input signal 202 is high, GRMC 240 may adjust the configuration of charge sharing circuit 200 to reduce the signal range of the input signal of amplifier 210 to, for example, half (i.e., a reduction ratio of 0.5).

As another example, if the signal path gain is greater than or equal to the threshold gain, which may indicate that the signal range of input signal 202 is low, GRMC 240 can adjust the configuration of charge sharing circuit to maintain or slightly reduce the signal range of the input signal of amplifier 210. For example, the reduction ratio may be 0.9~1. In the embodiment that GRMC 240 adjusts the capacitance values of capacitors 203, 205, and 207 corresponding to the signal path gain, the reduction ratio can be expressed as $$\text{reduction\_ratio}=C1(\text{gain})/(C1(\text{gain})+C2a(\text{gain})+C2b(\text{gain})). \quad (2)$$

In the above formula (2), C1 (gain) represents the capacitance value of capacitor 203 in relation to the signal path gain. Similarly, C2a(gain) and C2b(gain) represent the capacitance values of capacitors 205 and 207 in relation to the signal path gain, respectively. In other words, according to some embodiments, the capacitance values of capacitors 203, 205, and 207 are variables in relation to the signal path gain.

In some embodiments, GRMC 240 can configure the capacitance values of capacitors 203, 205, and 207 based on at least one of a pre-defined gain-switch map or a pre-defined equation. A gain-switch map defines a mapping relation between the signal path gain and the capacitance values of capacitors 203, 205, and 207. An equation defines a mathematical relation between the signal path gain and the capacitance values of capacitors 203, 205, and 207. The gain-switch map and the equation can be defined based on, for example, experimental data and be used to calculate the capacitance values of capacitors 203, 205, and 207 using the signal path gain. In some other embodiments, GRMC 240 can also change the connections of capacitors 203, 205, and 207 based on at least one of the pre-defined gain-switch map or the pre-defined equation.

In some embodiments, the pre-defined gain-switch map and/or the equation can be defined based on two requirements: (1) the signal range of the input signal of amplifier 210 is sufficiently reduced such that it is safe to operate low voltage digital MOSFET devices in amplifier 210, and/or (2) the reduction ratio is sufficiently small in order to obtain a higher signal-to-noise ratio (SNR) of comparator 107. A person of ordinary skill in the art should understand that the gain-switch map and/or the equation can be defined in any desired manner to enable adjusting the configuration of charge sharing circuit 200. In some other embodiments, as detailed below, GRMC 240 may configure the connections amount the capacitors in charge sharing circuit 200, and thus, to adjust the reduction ratio. By configuring the capacitance values of capacitors 203, 205, and 207 and/or the connections of the capacitors, to obtain a desired reduction ratio, GRMC 240 can maintain or improve SNR of comparator 107.

Using charge sharing circuit 200 including capacitors 203, 205, and 207, the signal range of input signal 202 can be reduced to, for example, a signal range that is safe for operation of the low voltage digital MOSFETs of amplifiers 210, 220, and 230. As a result, the layout size of comparator 107 can be reduced. Additionally, because low voltage digital MOSFETs may have gate capacitors that are smaller than their analog counterparts, the conversion speed of comparator 107 may be increased. Furthermore, the power supper voltage of amplifiers 210, 220, and 230 may also be reduced to, e.g., half of that of an analog power supply voltage, and therefore reducing the power consumption of comparator 107.

In some embodiments, when GRMC 240 adjust the configuration of charge sharing circuit 200 to reduce the signal range of input signal 202, GRMC 240 can also adjust the slope of ramping signal 272 such that comparator 107 provides output signal 232 as if there is no signal range reduction of input signal 202. Adjusting the slope of ramping signal 272 is also referred to as compensation, which may be performed by adjusting at least one of a frequency of counter 260 and the bias strength of bias signals 282 generated by bias generator 280. The detail of compensation is described below.

Referring to FIG. 2, in some embodiments, GRMC 240 provides control signals 246 to ramp signal generator 106. Control signals 246 may include, for example, a clock signal, an enable signal, and/or a reset signal. In some embodiments, after receiving the reset signal, counter 260 can be reset to an initial counter value (e.g., "0000"). The counter value of counter 260 can start to increase from the initial counter value using the clock signal. For example, each rising edge (or each rising and falling edges) of the clock signal may trigger the counter value of counter 260 to increase by one position. The counter value may be represented by a ramp code signal 262. For example, for a 4-bit counter, ramp code signal 262 can increase from "0000" to "1111." A person of ordinary skill in the art should understand that any type of counter can be used to implement counter 260.

Referring to FIG. 2, DAC 270 receives biasing signals 282 and ramp code signal 262. Bias generator 280 generates biasing signals 282, which may be one or more current signals and/or one or more voltage signals. Biasing signals 282 can enable transistors in DAC 270 to operate under proper biasing conditions. DAC 270 converts ramp code signal 262 to ramping signal 272. Ramping signal 272 may be, for example, an analog voltage signal "Vramp." One of ordinary skill in the art should understand that DAC 270 can be any type of digital to analog converter. Moreover, ramping signal generator 106 can include any type of circuit that generates a ramping signal. For example, ramping signal generator 106 may be the ramp signal generator described in U.S. provisional Patent Application No. 61/915,444, filed on Dec. 12, 2013, and U.S. non-provisional patent application Ser. No. 14/560,371, filed on Dec. 4, 2014, entitled "Method and System for Generating a Ramping Signal". Both applications are incorporated herein by reference.

As described above, GRMC 240 may perform compensation to adjust the slope of ramping signal 272 based on signal path gain 206. GRMC 240 may determine whether a signal range reduction ratio compensation is required by using, for example, signal path gain 206. When the signal range reduction ratio compensation is required or preferred, GRMC 240 can determine the amount of the signal range reduction ratio compensation and adjust at least one of the counter frequency and the digital-to-analog converter biasing signal based on the determined amount of the signal range reduction ratio compensation. In some embodiments, adjusting the slope of ramping signal 272 to a desired value can compensate the total gain-related signal range reduction of input signal 202. For example, in some embodiments, the signal range reduction ratio compensation can be the same as the signal range reduction ratio. As a result, the signal-to-noise ratio of output signal 232 of comparator 107 may remain the same as if there is no gain-related voltage range reduction.

In some embodiments, GRMC 240 can generate control signals 246 based on signal path gain 206. Using control signals 246, GRMC 240 can adjust the counting frequency of counter 260 and/or the strength of biasing signals 282. The counting frequency of counter 260 and/or the strength of biasing signals 282 may in turn affect, for example, be proportional to, the slope of ramping signal 272. As an example, GRMC 240 may increase the frequency of a clock signal received by counter 260 and thus increase the counter frequency. By increasing the counter frequency, counter 260 generates the ramp codes faster and in turn, DAC 270 generates ramping signal 272 faster. As a result, GRMC 240 enables the ramp signal generator 106 to increase the slope of ramping signal 272.

In some embodiments, adjusting the slope of ramping signal 272 to a desired value can compensate a portion of the gain-related voltage range reduction of input signal 202. As a result, the signal-to-noise ratio of output signal 232 of comparator 107 may change, for example, as if there is a signal path gain added.

Referring to FIG. 2, GRMC 240 can generate a mode control signal 244. Mode control signal 244 enables the configuration of an amplifier gain of amplifier 220. The amplifier gain measures the increase of voltage or current from the amplifier input to the amplifier output. For example, GRMC 240 may generate mode control signal 244 to be high to configure the amplifier gain of amplifier 220 to be high; or generate mode control signal 244 to be low to configure the amplifier gain of amplifier 220 to be low. The amplifier gain of amplifier 220 may affect the vertical fixed pattern noise (VFPN) performance of image sensor 100.

Referring to FIGS. 1 and 2, in some embodiments, mismatches between one or more comparators 107 may contribute to the VFPN of image sensor 100. The mismatches of comparators 107 may include offset mismatches and/or delay mismatches. An offset mismatch is a mismatch represented by voltage offset and is due to variations of device threshold, geometry, doping density, etc., introduced in the fabrication process. A delay mismatch is a mismatch represented by propagation time delay from the input of a comparator to the output of a comparator. For example, the time delay may be different for two different comparators 107A and 107B. In some embodiments, the delay mismatch dominates under a low signal path gain condition; and the offset mismatch dominates under a high signal path gain condition. The offset mismatch may be reduced when, for example, amplifier 220 has a high amplifier gain. And the delay mismatch may be reduced when amplifier 220 has a low amplifier gain. A low amplifier gain may correspond to a high amplifier bandwidth and a high conversion speed of comparator 107. A high amplifier gain may correspond to a low amplifier bandwidth and a low conversion speed of comparator 107. Therefore, under a low signal path gain condition, GRMC 240 can configure amplifier 220 to have a low amplifier gain in order to reduce the delay mismatch. And under a high signal path gain condition, GRMC 240 can configure amplifier 220 to have a high amplifier gain in order to reduce the offset mismatch. As a result, under both low and high signal path gain conditions, GRMC 240 can control amplifier 220 to have a proper amplifier gain to reduce the VFPN of image sensor 100.

Figure 3:
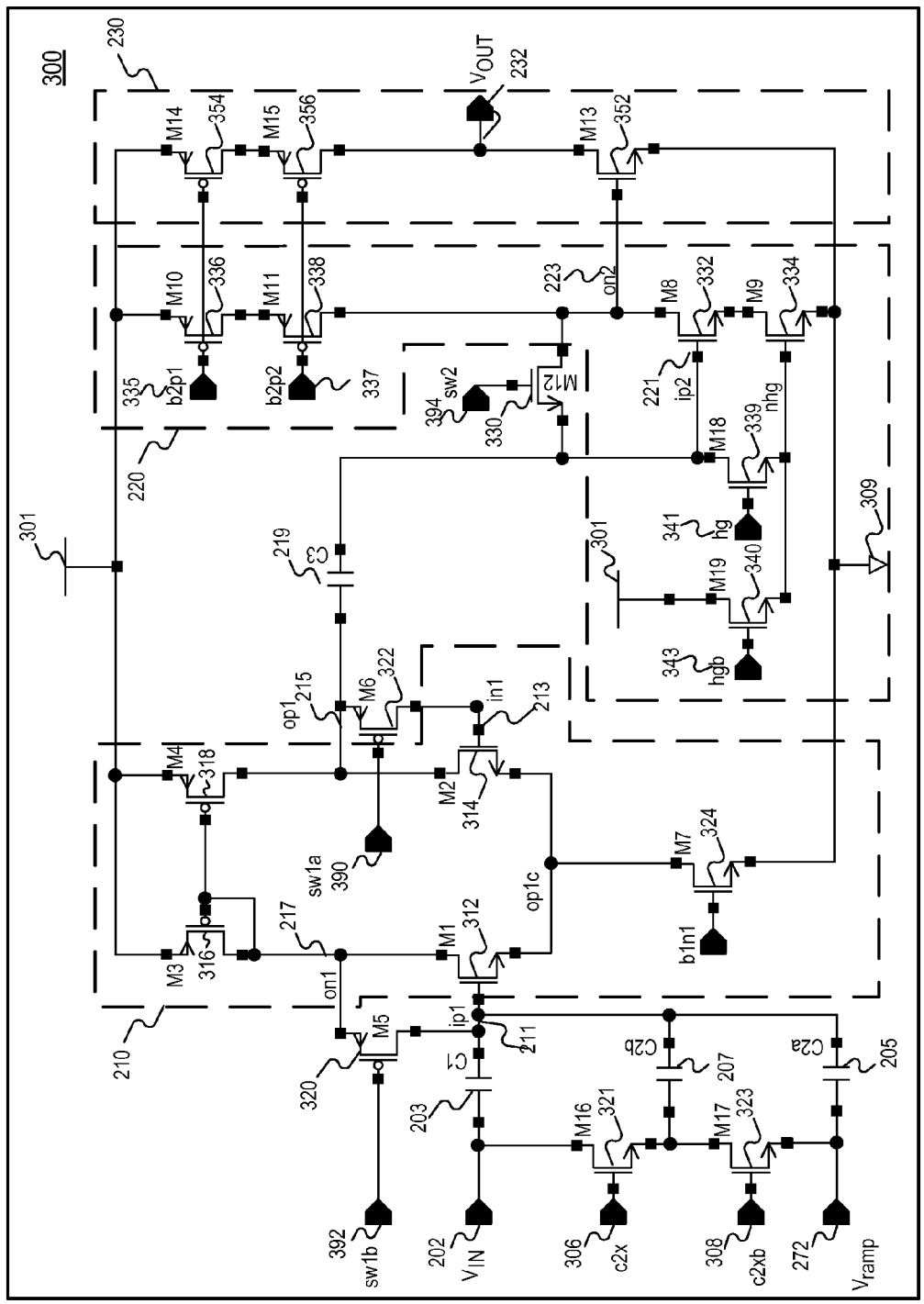
FIG. 3 is a circuit diagram illustrating an exemplary comparator circuit corresponding to the diagram shown in FIG. 2.

FIG. 3 is a circuit diagram illustrating an exemplary comparator circuit 300 corresponding to the block diagram of comparator 107 shown in FIG. 2. Referring to FIGS. 2 and 3, comparator circuit 300 includes transistors 312, 314, 316, 318, and 324 (e.g., M1, M2, M3, M4, and M7, respectively). In some embodiments, these transistors are included in amplifier 210. Comparator circuit 300 can also include capacitors 203, 205, 207; and transistors 321 and 323 (e.g., M16, and M17, respectively). In some embodiments, transistors 312, 314, 324, 321, and 323 can be NMOS transistors; and transistors 316 and 318 can be PMOS transistors.

As shown in FIGS. 2 and 3, capacitors 203, 205, and 207, transistors 321 and 323, and their interconnections, can form the charge sharing circuit 200. In the charge sharing circuit, the first terminal of capacitor 203 receives input signal 202. The second terminal of capacitor 203 is electrically coupled to the gate terminal of transistor 312 (i.e., the first input terminal 211 of amplifier 210). The first terminal of capacitor 205 receives ramping signal 272. The second terminal of capacitor 205 is electrically coupled to the gate terminal of transistor 312. The first terminal of capacitor 207 is electrically coupled to the source terminal of transistor 321 and the drain terminal of transistor 323. The drain terminal of transistor 321 is electrically coupled to input signal 202. The source terminal of transistor 323 is electrically coupled to ramping signal 272.

In the charge sharing circuit 200, transistors 321 and 323 can operate as switches. The gate terminals of transistors 321 and 323 are electrically coupled to capacitor control signals 306 (e.g., c2x) and 308 (e.g., c2xb), respectively. In some embodiments, control signals 306 and 308 can be part of the control signal 242 generated by GRMC 240. In some embodiments, when control signal 306 is high, transistor 321 is turned on and conducts current. The first terminal of capacitor 207 thus receives input signal 202. When control signal 308 is high, transistor 323 is turned on and conducts current. The first terminal of capacitor 207 receives ramping signal 272. In some embodiments, control signals 306 and 308 are complimentary and may not be both high or both low. In some embodiments, transistors 321 and 323 are optional, and the first terminal of capacitor 207 may be electrically coupled to an electrical ground.

Referring to FIG. 3, when control signals 306 and 308 receive different combination of values, different reduction ratios may be obtained. For example, when control signal 306 is low and 308 is high, the reduction ratio equals to the capacitance value of capacitor 203 divided by the sum of the capacitance values of capacitors 203, 205, and 207, i.e., reduction_ratio=$C1/(C1+C2a+C2b)$. When control signal 306 is high and control signal 308 is low, the reduction ratio equals to the sum of the capacitance value of capacitors 203 and 205 divided by the sum of the capacitance values of capacitors 203, 205, and 207, i.e., reduction_ratio=$(C1+C2b)/(C1+C2a+C2b)$. As an example, when control signal 306 is low and 308 is high and when capacitors C1, C2a, and C2b are configured such that $C1=6*C0$, $C2a=3*C0$, and $C2b=3*C0$, the reduction ratio is 1/2. And when control signal 306 is high and control signal 308 is low, the reduction ratio is 3/4. In the above example, C0 can be any capacitance value.

Referring to FIG. 3, transistors 312 and 314 form a differential circuit. Transistor 324 forms a current generating circuit for providing current. And transistors 316 and 318 form a current mirror circuit or a load circuit. A differential circuit can steer current from one part of the circuit to another. For example, if the gate terminal of transistor 312 receives a signal having a higher than the signal received by the gate terminal of transistor 314, current can be steered from the right part of the circuit (i.e., the part of the circuit including transistors 314 and 318) to the left part of the circuit (i.e., the part of the circuit including transistors 312 and 316). As a result, the output signal provided at second output terminal 215 of amplifier 210 may be high.

Referring to FIG. 3, second output terminal 215 of amplifier 210 is electrically coupled to the first terminal of capacitor 219. The second terminal of capacitor 219 is electrically coupled to input terminal 221 of amplifier 220 (e.g., "ip2"). As shown in FIG. 3, comparator circuit 300 can include transistors 332, 334, 336, 338, 339, and 340 (e.g., M8, M9, M10, M11, M18, and M19, respectively). These transistors are included in amplifier 220. In some embodiments, transistors 332, 334, 339, and 340 can be NMOS transistors; and transistors 336 and 338 can be PMOS transistors.

As shown in FIG. 3, the gate terminal of transistor 332 is electrically coupled to the second terminal of capacitor 219, which receives the output signal provided at second output terminal 215 of amplifier 210. The source terminal of transistor 332 is electrically coupled to the drain terminal of transistor 334. The drain terminal of transistor 332 is electrically coupled to the drain terminal of transistor 338. The source terminal of transistor 334 is electrical coupled to electrical ground 309. The gate terminal of transistor 334 is electrically coupled to the source terminals of transistors 339 and 340. The operation of transistors 336, 338, 339, and 340 are described in detail below.

Amplifier 220 can generate an inverting output signal based on its input signal. As described in the above example, the output signal provided at second output terminal 215 of amplifier 210 may be high when the gate terminal of transistor 312 receives a high signal; and may be low when the gate terminal of transistor 312 receives a low signal. The output signal provided at second output terminal 215 of amplifier 210 is electrically coupled to the gate terminal of transistor 332 through capacitor 219. Therefore, when the gate terminal of transistor 332 receives a high, transistor 332 may conduct current and operate in a desired region (e.g., saturation region). As a result, when transistor 334 also conducts current, the output signal provided at output terminal 223 of amplifier 220 is low because transistors 332 and 334 form a path to electrical ground 309.

As shown in FIG. 3, the gate terminals of transistors 336 and 338 receive control signals 335 and 337 (e.g., "b1p1" and "b2p2", respectively). Control signals 335 and 337 are biasing signals generated by a biasing circuit of comparator 300 (not shown).

As described above, GRMC 240 can generate mode control signal 244 to enable the configuration of the amplifier gain of amplifier 220. Control signals 341 and 343 may be part of or generated based on mode control signal 244. In some embodiments, when control signal 341 is low and control signal 343 is high, the gate terminal of transistor 334 receives a high signal. Transistor 334 may conduct current and operate as a switch. As a result, the output impedance at output terminal 223 of amplifier 220 may be relatively small, and the resistance-capacitance (RC) time constant at output terminal 223 of amplifier 220 is also relatively small. When the RC time constant is small, amplifier 220 may have a relatively high operating speed, but a relatively low amplifier gain. When control signal 341 is high and control signal 343 is low, the gate terminal of transistor 334 is electrically coupled to the second terminal of capacitor 219 through transistor 339 and coupled to the gate terminal of transistor 332. Transistors 332 and 334 thus receive the same or similar input signals and operate in serial. As a result, the output impedance at output terminal 223 of amplifier 220 may be relatively high, and the RC time constant at output terminal 223 of amplifier 220 is also relatively large. When the RC time constant is large, amplifier 220 may have a relatively low operating speed, but a relatively high amplifier gain. A high amplifier gain may reduce the residue error after the auto-zero phase.

Comparator circuit 300 may also include transistors 352, 354, and 356 (e.g., M13, M14, and M15). These transistors are included in amplifier 230. In some embodiments, transistor 352 can be an NMOS transistor; and transistors 354, and 356 can be PMOS transistors. The gate terminal of transistor 352 is electrically coupled to output terminal 223 of amplifier 220. The source terminal of transistor 352 is electrically coupled to electrical ground 309. The drain terminal of transistor 352 is electrically coupled to the drain terminal of transistor 356. The source terminal of transistor 356 is electrically coupled to the drain terminal of transistor 354. The drain terminal of transistor 354 is electrically coupled to power supply 301. The gate terminals of transistors 354 and 356 receive control signals 335 and 337, respectively.

Amplifier 230 can generate an inverting output signal based on its input signal. As described in the above example, the output signal provided at output terminal 223 of amplifier 220 may be low. Therefore, the gate terminal of transistor 352 receives a low signal. As a result, transistor 352 may not conduct current or may only weakly conduct current. Therefore, the signal level of output signal 232 may be high because transistors 354 and 356 may form a signal path to power supply 301. The operation of transistors 354 and 356 may be the same or similar to the operation of transistors 336 and 338, and therefore are not repeated.

Referring to FIGS. 2 and 3, comparator circuit 300 may also include transistors 320, 322, and 330 (e.g., M5, M6, and M12). In some embodiments, transistors 320 and 322 can be PMOS transistors; and transistor 330 can be an NMOS transistor. Transistors 320, 322, and 330 can operate as switches (e.g., switches 290, 292, and 294, respectively.)

As shown in FIG. 3, the gate terminals of transistors 320 and 322 are electrically coupled to control signals 392 and 390, respectively (e.g., sw1b and sw1a). The source terminals of transistors 320 and 322 are electrically coupled to first output terminal 217 and second output terminal 215 of amplifier 210, respectively. The drain terminals of transistors 320 and 322 are electrically coupled to first input terminal 211 and second input terminal 213 of amplifier 210, respectively. In the auto-zero phase, to turn on transistors 320 and 322, the gate terminals of transistor 320 and 322 may both receive a low from control signals 392 and 390, respectively. When transistor 320 is turned on, it electrically connects first input terminal 211 with first output terminal 217 of amplifier 210. Similarly, when transistor 322 is turned on, it electrically connects second input terminal 213 with second output terminal 217 of amplifier 210.

Similarly, the gate terminal of transistor 330 is electrically coupled to control signal 394. The source terminal of transistor 330 is electrically coupled to input terminal 221 of amplifier 220. The drain terminal of transistor 330 is electrically coupled to output terminal 223 of amplifier 220. Thus, in an auto-zero phase, to turn on transistor 330, the gate terminal of transistor 330 may receive a high from control signal 394. When transistor 330 is turned on, it electrically connects input terminal 221 with output terminal 223 of amplifier 220. The detail of the auto-zero operation is described above and thus not repeated.

Figure 4:
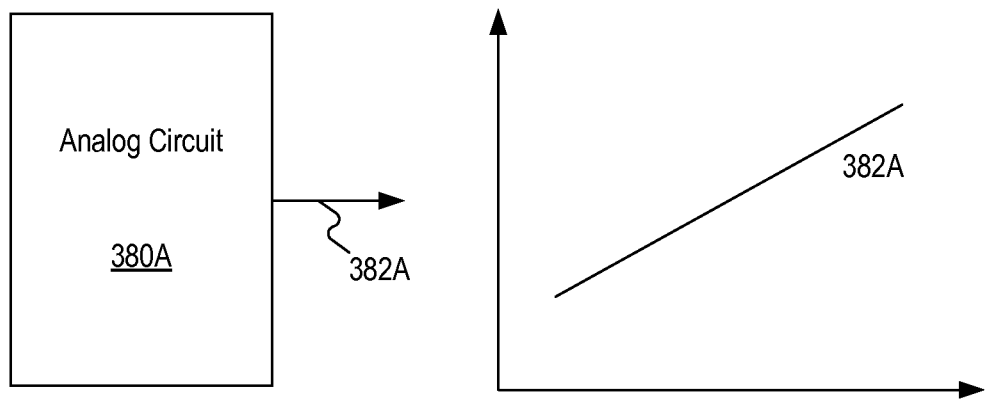
FIG. 4 is a block diagram illustrating a digital circuit and an analog circuit.
Figure 4:
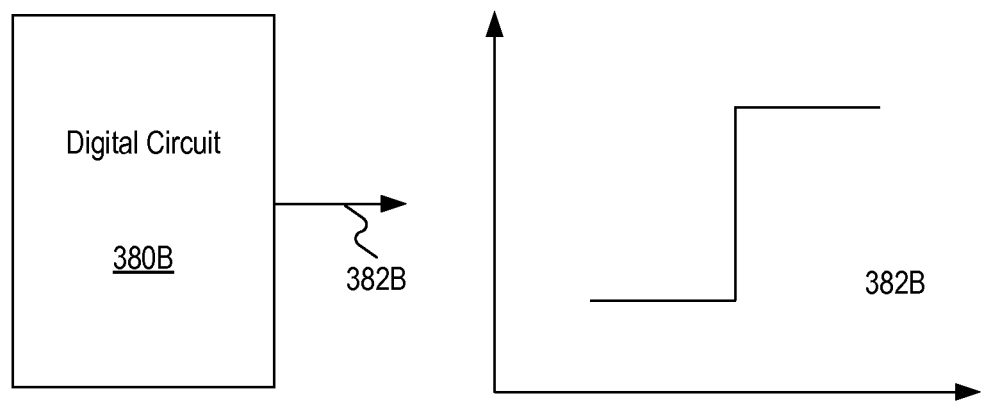

FIG. 4 is a block diagram illustrating an analog circuit 380A and a digital circuit 380B. Referring to FIGS. 3 and 4, the transistors included in comparator 300 can be digital transistors. Digital transistors can form digital circuits that generate digital signals. A digital signal is a signal in a form of "on" or "off" that correspond to binary digits and can be stored in computer memory. In contrast, an analog signal is a signal in a form that can vary continuously in a range. An analog signal may not be stored in computer memory. For example, analog circuit 380A may include one or more analog transistors and generate an analog output signal 382A. As shown in FIG. 4, output signal 382A may continuously vary from a first stable value to a second stable value. In contrast, digital circuits 380B may include one or more digital transistors and generate a digital output signal 382B. Output signal 382B may have two stable values and may vary from a first stable value (e.g., 0) to a second stable value (e.g., 1) in a binary manner.

Further, in a same processing technology (e.g., a 130 nm technology), analog transistors have minimum feature sizes that are greater than those of digital transistors. For example, a high voltage analog MOSFET may have a minimum width (Wmin) of 0.4 micro meter (0.4 um) and a minimum length (Lmin) of 0.35 um. In contrast, a low voltage digital MOSFET may have a minimum width of 0.15 um, and a minimum length of 0.13 um. As such, the area of a minimum size of an analog MOSFET may be seven times higher than that of a minimum size digital MOSFET. Analog transistors also have thick gate oxide and can thus withstand higher power supply voltage than digital transistors. Digital transistors, having thinner gate oxide than the analog transistors, can switch faster than analog transistors. A typical voltage value that an analog transistor can withstand is 3.3V plus a design margin. A digital transistor can withstand about or less than 1.8V plus a design and/or processing margin, for example, about 1.8V, 1.5V, 1.2V, 1.0V, or 0.9V (plus design and/or processing margin), depending the processing technology.

The comparator circuit 300 shown in FIG. 3 can include both high voltage analog transistors and low voltage digital transistors. In some embodiments, the transistors of comparator circuit 300 shown in FIG. 3 include at least one digital transistor, or a plurality of digital transistors. Or, the comparator can be a digital comparator with all of the transistors being digital transistors. In some other embodiments, amplifier 210 includes one or more digital transistors, or all of the transistors that form amplifier 210 are digital transistors. Similarly, amplifiers 220 and 230 each may include one or more digital transistors, or all of the transistors that form amplifiers 220 and 230 are digital transistors. In some embodiments, some of the switches used in comparator circuit 300, for example, switches 321, 323, 320, 322, and 330 can be digital transistors.

Figure 5:
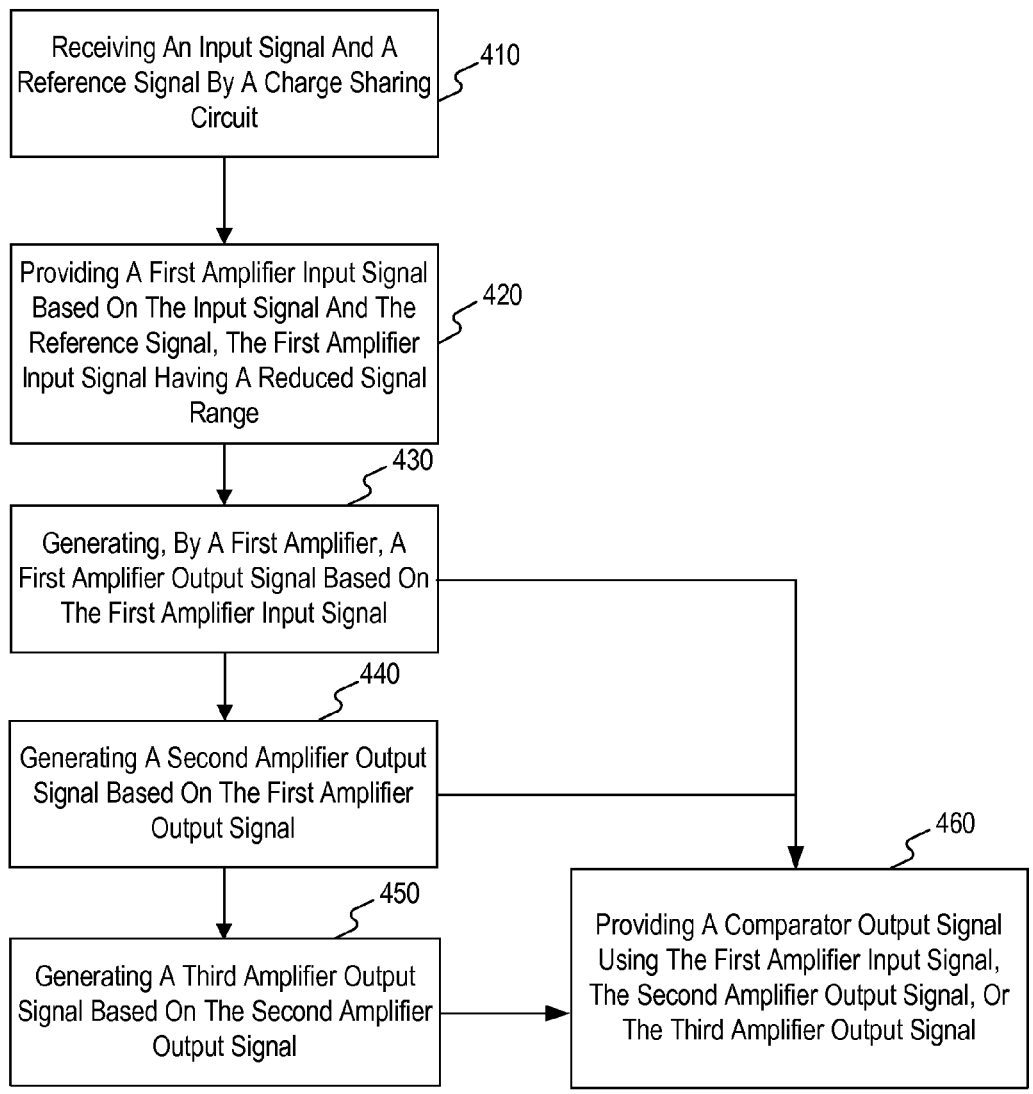
FIG. 5 is a flowchart representing an exemplary method for comparing a ramping signal and an analog input signal.

FIG. 5 is a flowchart representing an exemplary method 400 for comparing a ramping signal and an analog input signal. It will be readily appreciated that the illustrated procedure can be altered to include less or more steps. In an initial step 410, an analog input signal and a ramping signal are applied to a charge sharing circuit 200 of a comparator 107. The charge sharing circuit 200 may include, for example, capacitors 203, 205, and 207. The charge sharing circuit can provide (step 420) a first amplifier input signal based on the analog input signal and the ramping signal. In some embodiments, capacitors 203, 205, and 207 and/or the connections among capacitors 203, 205, and 207 can be configured by, for example, GRMC 240 such that a first amplifier 210 input signal has a signal range that is reduced from the signal range of the analog input signal based on the capacitance values of the capacitors and/or the configurations of the connections of the capacitors.

In some embodiments, amplifier 210 generates (step 430) a first amplifier output signal based on the first amplifier input signal. In other embodiments, the first amplifier output signal may be provided to a second amplifier 220, which may generate (step 440) a second amplifier output signal based on the first amplifier output signal. And the second amplifier output signal may be provided to a third amplifier 230, which may generate (step 450) a third amplifier output signal based on the second amplifier output signal. In step 460, one of the first, second, or third amplifier output signal may be provided as the output signal of comparator 107.

Figure 6:
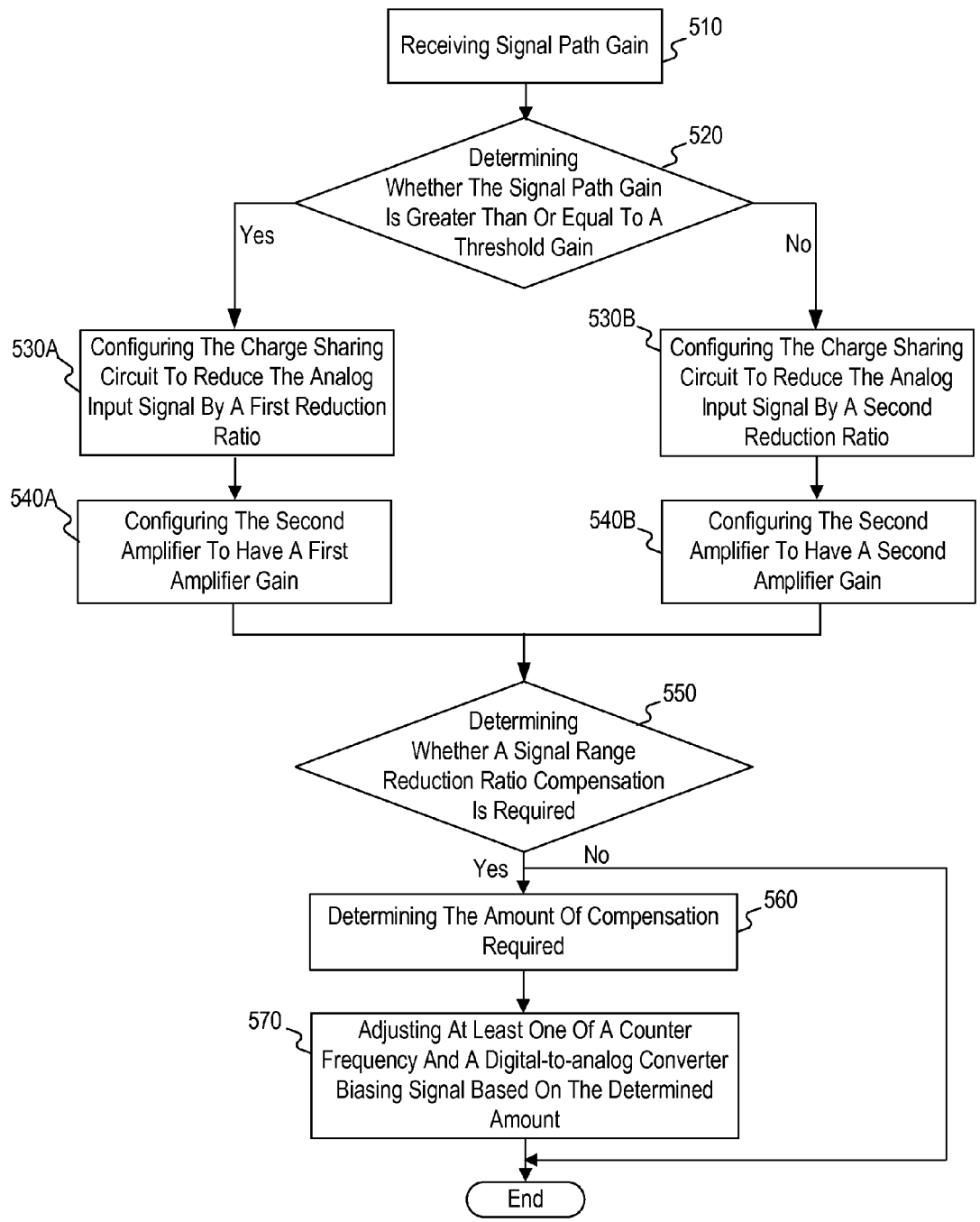
FIG. 6 is a flowchart representing an exemplary method for operating a gain-related mode control circuit.

FIG. 6 is a flowchart representing an exemplary method 500 for operating GRMC 240. It will be readily appreciated that the illustrated procedure can be altered to include less or more steps. In an initial step 510, GRMC 240 may receive a signal path gain. GRMC 240 may determine (step 520) whether the signal path gain is greater than or equal to a threshold gain. In some embodiments, when the signal path gain is greater than or equal to the threshold gain, GRMC 240 may configure (step 530A) the charge sharing circuit to reduce analog input signal 202 by a first reduction ratio. And when the signal path gain is less than the threshold gain, GRMC 240 may configure (step 530B) the charge sharing circuit to reduce analog input signal 202 by a second reduction ratio. The second reduction ratio is greater than the first reduction ratio. For example, GRMC 240 reduces the signal range of analog input signal 202 less when the signal path gain is greater than the threshold gain than when the signal path gain is less than the threshold gain. GRMC 240 can configure the charge sharing circuit using at least one of a pre-defined gain-switch map or a pre-defined equation. One of ordinary skill in the art should appreciate that the dividing point of the configuration of GRMC 240 can vary. For example, the configuration of "greater than or equal to" can be changed to "greater than," and "less than" can be changed to "less than or equal to." These variations should be considered equivalent.

In some embodiments, when the signal path gain is greater than or equal to the threshold gain, GRMC 240 can also configure (step 540A) amplifier 220 to have a first amplifier gain. And when the signal path gain is less than the threshold gain, GRMC 240 can configure (step 540B) amplifier 220 to have a second amplifier gain. The second amplifier gain is smaller than the first amplifier gain. For example, GRMC 240 configures amplifier 220 to have a higher gain when the signal path gain is greater than or equal to the threshold gain than when the signal path gain is less than the threshold gain. Similarly, one of ordinary skill in the art should also appreciate that, in some embodiments, GRMC 240 can configure amplifier 220 to have a first amplifier gain when the signal path gain is greater than the threshold gain, and configure amplifier 220 to have a second amplifier gain when the signal path gain is less than or equal to the threshold gain. Similarly, the configuration of "greater than or equal to" can be changed to "greater than," and "less than" can be changed to "less than or equal to." These variations should be considered equivalent.

Referring to FIG. 6, GRMC 240 may further determine (step 550) whether a signal range reduction ratio compensation is required. When the signal range reduction ratio compensation is required, GRMC 240 may determine (step 560) the amount of the signal range reduction ratio compensation; and adjust (step 570) at least one of a counter frequency and a digital-to-analog converter biasing signal based on the determined amount of the signal range reduction ratio compensation. It is appreciated by one of ordinary skill in the art that method 500 can also be repeated as desired.

In the preceding specification, the subject matter has been described with reference to specific exemplary embodiments. It will, however, be evident that various modifications and changes may be made without departing from the broader spirit and scope of the subject matter as set forth in the claims that follow. The specification and drawings are accordingly to be regarded as illustrative rather than restrictive. Other embodiments may be apparent to those skilled in the art from consideration of the specification and practice of the embodiments disclosed herein.

What is claimed is:

1. An image sensing system comprising:
a comparator for comparing an input signal representing a sensed light signal from at least one pixel of the image sensing system and a reference signal, the comparator including at least one digital transistor, wherein the comparator includes a charge sharing circuit for generating a first amplifier input signal based on at least the input signal, the first amplifier input signal having a signal range that is reduced from the signal range of the input signal; and
a controller electrically coupled to the comparator, wherein the controller is configured to:
receive a signal representing a signal path gain of the comparator,
adjust a reduction ratio of the input signal by configuring the charge sharing circuit,
determine whether a signal range reduction ratio compensation is required,
in response to determining that the signal range reduction ratio compensation is required, determine an amount of the signal range reduction ratio compensation, and
adjust at least one of a counter frequency or a digital-to-analog converter biasing signal of the image sensing system based on the determined amount of the signal range reduction ratio compensation.

2. The image sensing system of claim 1, wherein at least one digital transistor has a maximum withstand voltage of about or less than 1.8V.

3. The image sensing system of claim 1, wherein the charge sharing circuit includes a plurality of capacitors, and wherein the charge sharing circuit is capable of reducing a signal range based on a configuration of the charge sharing circuit.

4. The image sensing system of claim 3, wherein the plurality of capacitors include a first capacitor, a second capacitor, and a third capacitor, each including a first terminal and a second terminal, the first terminal of the first capacitor being configured to receive the input signal and the first terminal of the third capacitor being configured to receive the reference signal.

5. The image sensing system of claim 4, wherein the charge sharing circuit further includes a first switch electrically coupled between the first terminals of the first and second capacitors and a second switch electrically coupled between the first terminals of the second and third capacitors.

6. The image sensing system of claim 1, wherein the controller is further configured to:
  determine whether the signal path gain is greater than or equal to a threshold gain;
  when the signal path gain is greater than or equal to the threshold gain, configure the charge sharing circuit to reduce the input signal by a first reduction ratio; and
  when the signal path gain is less than the threshold gain, configure the charge sharing circuit to reduce the input signal by a second reduction ratio, the second reduction ratio being greater than the first reduction ratio.

7. The image sensing system of claim 1, wherein configuring the charge sharing circuit is based on at least one of a pre-defined gain-switch map or a pre-defined equation.

8. The image sensing system of claim 1, wherein the comparator includes a first amplifier having at least one digital transistor, the first amplifier being electrically coupled to the charge sharing circuit for generating a first amplifier output signal based on the first amplifier input signal.

9. The image sensing system of claim 8, wherein the comparator further includes a second amplifier, the second amplifier being electrically coupled to the first amplifier for generating a second amplifier output signal based on the first amplifier output signal, wherein an amplifier gain of the second amplifier is adjustable based on a signal path gain of the comparator circuit.

10. The image sensing system of claim 9, wherein the comparator further includes a third amplifier, the third amplifier being electrically coupled to the second amplifier for generating a third amplifier output signal based on the second amplifier output signal.

11. The image sensing system of claim 1, further comprising a ramp signal generator electrically coupled to the comparator for generating the reference signal, wherein the ramp signal generator includes a counter, a bias generator, and a digital to analog converter.

12. An image sensing system comprising:
  a comparator for comparing an input signal representing a sensed light signal from at least one pixel of the image sensing system and a reference signal, the comparator including a charge sharing circuit for reducing a signal range of the input signal; and
  a controller electrically coupled to the comparator, wherein the controller is configured to:
    receive a signal representing a signal path gain of the comparator,
    adjust a reduction ratio of the input signal by configuring the charge sharing circuit,
    determine whether a signal range reduction ratio compensation is required,
    in response to determining that the signal range reduction ratio compensation is required, determine an amount of the signal range reduction ratio compensation, and
    adjust at least one of a counter frequency or a digital-to-analog converter biasing signal of the image sensing system based on the determined amount of the signal range reduction ratio compensation.

13. The image sensing system of claim 12, wherein the comparator includes at least one digital transistor.

14. The image sensing system of claim 13, wherein the at least one digital transistor has a maximum withstand voltage of about or less than 1.8V.

15. The image sensing system of claim 12, wherein the charge sharing circuit includes a plurality of capacitors, and wherein the charge sharing circuit is capable of reducing the signal range based on a configuration of the charge sharing circuit.

16. The image sensing system of claim 12, wherein the comparator includes a first amplifier having at least one digital transistor, the first amplifier being electrically coupled to the charge sharing circuit.

17. A method for comparing a reference signal and an input signal representing a sensed light signal from at least one pixel of an image sensing system, the method comprising:
  receiving the input signal and the reference signal by a charge sharing circuit;
  providing, by the charge sharing circuit, a first amplifier input signal based on at least the input signal and the reference signal;
  generating, by a first amplifier having at least one digital transistor, a first amplifier output signal based on the first amplifier input signal;
  receiving a signal representing a signal path gain of the comparator;
  adjusting a reduction ratio of the input signal by configuring the charge sharing circuit;
  determining whether a signal range reduction ratio compensation is required;
  in response to determining that the signal range reduction ratio compensation is required, determining an amount of the signal range reduction ratio compensation; and
  adjusting at least one of a counter frequency or a digital-to-analog converter biasing signal of the image sensing system based on the determined amount of the signal range reduction ratio compensation.

18. The method of claim 17, wherein the first amplifier input signal has a signal range that is reduced from the signal range of the input signal based on a configuration of the charge sharing circuit.

* * * * *